May 27, 1969 W. P. LOCKSHAW 3,447,099

SWEEP GENERATOR HAVING A FIELD-EFFECT TRANSISTOR BETWEEN THE TIMING AND DISCHARGE CIRCUITS

Filed Feb. 2, 1968

INVENTOR:
William P. Lockshaw

By [signature]

ATTORNEY

United States Patent Office 3,447,099

Patented May 27, 1969

3,447,099

SWEEP GENERATOR HAVING A FIELD-EFFECT TRANSISTOR BETWEEN THE TIMING AND DISCHARGE CIRCUITS

William Paul Lockshaw, Canoga Park, Calif., assignor to International Telephone and Telegraph Corporation, New York, N.Y., a corporation of Delaware Filed Feb. 2, 1968, Ser. No. 702,673
Int. Cl. H03k 3/26
U.S. Cl. 331—111 11 Claims

ABSTRACT OF THE DISCLOSURE

The circuit of this invention uses a resistor-capacitor timing circuit having any desired time constant. A field-effect transistor isolation circuit is interposed between the resistor-capacitor junction and a unijunction transistor discharge circuit to prevent the unijunction transistor from applying a non-linear load to the capacitor, thereby distorting the linearity of the produced sawtooth sweep voltage. Further, a follower circuit is connected and controlled by the voltage on the emitter of the uni-junction device to control the current source which supplies current to the timing capacitor so that the current source delivers a substantially constant output current.

BACKGROUND OF THE INVENTION

The present invention relates to a sweep generator circuit and, more particularly, to an improved and economical sweep generator circuit having an output signal with exceptionally good linearity characteristics over a long period of time.

A sweep generator or sawtooth oscillator, as it is sometimes called, is desirable whenever a linearly changing voltage is required. A free-running sawtooth oscillator produces a series of sawtooth waveforms. The repetition frequency is normally determined entirely by the sawtooth oscillator circuit values. In the most common type of sawtooth oscillator, the sawtooth waveform is created as a result of a capacitor charging or discharging through a resistor. The voltage appearing across the capacitor is relatively linear for a length of time, dependent upon the time constant of the resistor-capacitor timing circuit.

The output signal of such a sawtooth oscillator becomes non-linear as the amplitude of the sawtooth voltage increases, whereby operation is usually confined to a linear portion of the curve. Attempts of the prior art to make the sawtooth oscillator generate a truly linear ramp voltage need very complex circuitry with a corresponding decrease in reliability and increased cost.

When large time constants are needed in the timing circuit to allow a slow rise of the sawtooth voltage, great care must be taken to ensure that the capacitance of the resistor-capacitor circuit is not loaded by an electrical element which would vary the characteristics of the resistor-capacitor circuit, changing the time constant and making the timing circuit non-linear.

Further, the element chosen to discharge the capacitor during the return sweep of the sawtooth voltage must have a characteristic which prevents a premature return.

To maintain the voltage across the capacitance of the resistor-capacitor timing circuit as a linear function of time, a capacitor should be charged with a constant current. The constant current increases the charge upon the timing capacitor, and hence the voltage across the timing capacitor, linearly with respect to time.

SUMMARY OF THE INVENTION

The circuit of this invention uses a resistor-capacitor timing circuit having any desired time constant. The resistance and capacitance values may be very large whereby the voltage across the capacitor during the charging portion of the cycle increases relatively slowly. The device of this invention uses a field effect transistor, or FET, in an isolation circuit to drive the emitter of, for example, a unijunction device in a discharge circuit with sufficient amplitude so that when the emitter of the unijunction device reaches a predetermined amplitude of voltage with respect to a first base, the emitter conducts to that first base and rapidly discharges the timing capacitor of the timing circuit through the gate and source terminals of the field effect transistor. A follower circuit, such as the emitter follower, is connected and controlled by the voltage on the emitter of the unijunction device to produce a sawtooth output signal voltage and to control the current source which supplies current to the timing capacitor so that the current source delivers a substantially constant output current. The value of the output current of the current source may be adjusted to vary the rise time of the voltage across the timing capacitor.

DESCRIPTION OF THE PREFERRED EMBODIMENT

Figure 1:
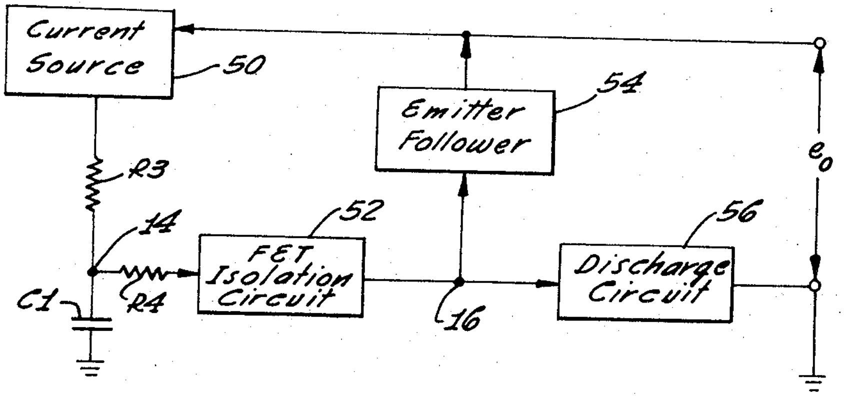
FIGURE 1 is a block diagram of a typical sawtooth generator circuit constructed in accordance with this invention.

With reference to FIGURE 1, current source 50 is connected to deliver current to a timing capacitor C1 through a timing resistor R3. The voltage across the timing capacitor C1 is applied through a resistor R4 to the gate terminal of a field effect transistor (FET) isolation circuit 52. Because of the high input impedance at the gate terminal of the field effect transistor isolation circuit 52, the isolation circuit 52, during charging of the caparitor C1, does not load or otherwise interfere with the voltage rise across the timing capacitor C1.

The field effect transistor isolation circuit 52 delivers a voltage at terminal 16 to a discharge circuit 56 to a follower circuit, such as an emitter follower circuit 54. When the voltage at terminal 16 reaches a predetermined amplitude, the discharge circuit 56 is adapted to discharge to the ground terminal thereby discharging the capacitor C1 through the resistor R4, the field effect transistor circuit 52 and the discharge circuit 56. The time of discharge is determined by the various impedances of the devices 52 and 56 and by the resistance of resistor R4 as well as the capacitance of capacitor C1.

The emitter follower circuit 54 produces an output voltage at the output terminals and is connected to control the current source 50 in a fashion to cause the voltage across resistor R3 to be substantially constant for all usable values of voltage appearing at terminal 14. Thus, current source 50 becomes a constant current source: for a constant voltage across R3 cannot be achieved without delivering a substantially constant current. Substantially no current flows, during the charging mode of operation, through resistor R4 because of the very high impedance of the gate-to-source path of the field effect transistor isolation circuit 52.

Figure 2:
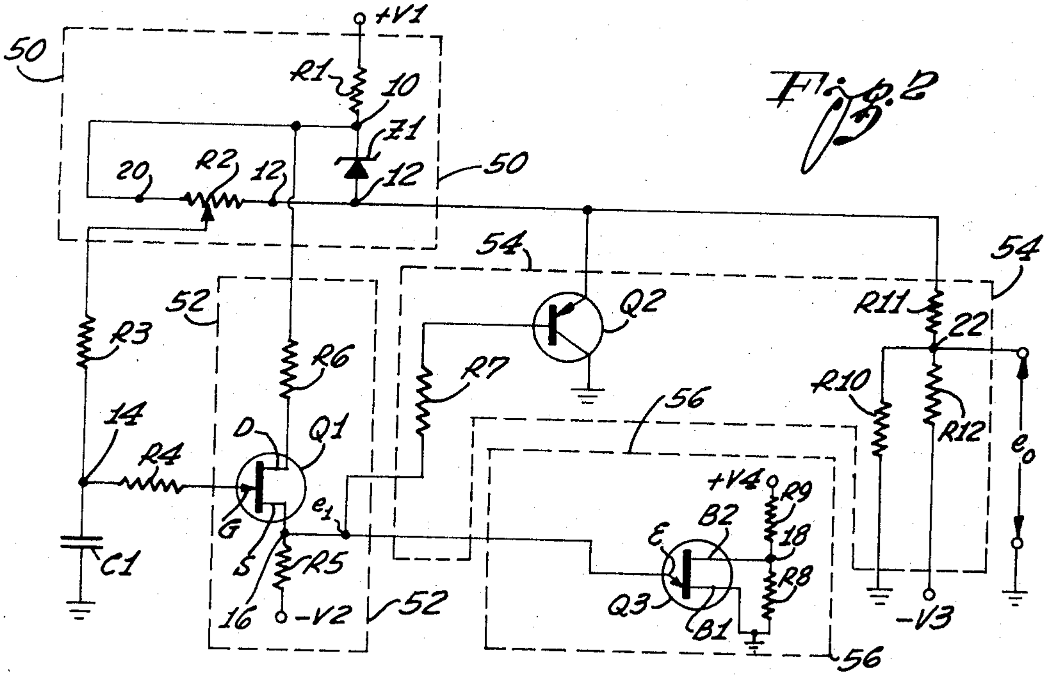
FIGURE 2 is a schematic diagram of a typical embodiment of a sawtooth generator constructed in accordance with this invention.

Reference should be made to FIGURE 2 for a more complete description of the typical embodiment of the invention. In the circuit of FIGURE 2, resistor R3 is connected in series with capacitor C1 to form a resistor-capacitor timing circuit. The junction 14 between resistor R3 and capacitor C1 is connected to one terminal of resistor R4 whose other terminal is connected to the gate tremial of a field effect transistor Q1. The terminal of resistor R3, not connected to junction 14, is connected to the movable arm of a potentiometer or variable resistor R2. The terminal 20 of variable resistor R2 is connected to terminal 10 of resistor R1. The other terminal of resistor R1 is connected to a source of voltage V1. A diode Z1 is zener-connected in parallel with the fixed terminals 12 and 20 of resistor R2, with the cathode connected to terminal 20 and the anode connected to terminal 12, for maintaining a substantially constant voltage drop across resistor R2. One terminal of capacitor C1 is connected to a common or ground terminal.

In the field effect transistor isolation circuit 52, the field effect transistor Q1 may, for example, be a metal-oxide-silicon (metal, silicon oxide, silicon) transistor. Other field effect transistors are under development. For example, a metal-nitride-silicon (metal, silicon nitride, silicon) transistor of the field effect transistor type is presently being developed. The source terminals of transistor Q1 is connected through a resistor R5 to the negative terminal of a voltage source V2. The drain terminal D of the field effect transistor Q1 is connected through current limiting resistor R6 to the junction 10 between resistors R1 and R2.

The source terminals of transistor Q1 is connected to the emitter terminal E of a unijunction transistor Q3 of the discharge circuit 56. A unijunction transistor is sometimes called a "double-base diode." See "Transistor Circuit Engineering" edited by R. F. Shea and published by John Wiley and Sons, Inc. in 1957. A unijunction transistor has a negative-resistance characteristic. That is, as the voltage between the emitter E terminal and the base B1 terminal increases, initially, substantially no current flows between the emitter E and the base B1 terminal. When a predetermined voltage between the emitter E and base B1 terminal is reached, a current starts to flow from the emitter E to the base B1 terminal and increases while the voltages between the emitter E and the B1 termnial decreases. Thus, with the base B1 terminal grounded, the unijunction transistor Q3 is an excellent discharge device. The base B2 terminal is biased by a voltage source V4 and a voltage dividing network comprising resistors R8 and R9 whose junction 18 is connected to the base terminal B2.

The emitter follower circuit 54 comprises a series resistor R7 connected between the base of a transistor Q2 and the terminal 16 at the source terminals of field effect transistor Q1. The collector of transistor Q2 is grounded to provide a porper operating potential to the transistor Q2. The emitter of transistor Q2 is connected in series with a resistor network comprising a resistor R11 connected in series with a resistor R12 to a negative voltage source V3. The output terminals of the device are the ground terminal and the junction between the resistors R11 and R12. A resistor R10 is connected across the output terminals to set the desired voltage levels of the output signal. The resistance values of resistors R10, R11 and R12 are used to scale the amplitude of the output voltage. The value and polarity of the voltage source V3 is chosen to translate the sawtooth output voltage, i.e., the voltage of source V3 merely biases the output voltage.

The emitter of the transistor Q2 is connected to the terminal 12 to control the output voltage of the current source 50 in a fashion which causes it to deliver a substantially constant current to the timing resistor R3 and timing capacitor C1.

In operation, current is delivered from voltage source V1 through resistor R1, resistor R2 and resistor R3 to the capacitor C1 to cause the voltage across the capacitor C1 to increase in a positive direction. The positive voltage across capacitor C1 appears, through resistor R4, on the gate terminal of field effect transistor Q1. Because of the high input impedance of the back-biased field effect transistor Q1, its connection to the terminal 14 during the charging mode of operation of the circuit does not load the capacitor C1. Current flow from voltage source V1 through resistor R1 and R6 flows from the drain D to the source terminals of field effect transistor Q1 and through resistor R5 and voltage source V2 in proportion to the voltage applied to the gate terminal G of the field effect transistor Q1. Thus, the voltage at the terminal 16 follows the voltage at the gate terminal G of the transistor Q1 and transistor Q1 isolates the load of the emitter follower circuit 54 and the discharge circuit 56 from the capacitor C1. It should be noted that with the polarity of voltages shown, the field effect transistor Q1 is of the type known as an "n-channel" field effect transistor.

The emitter follower transistor Q2 causes the voltage at terminal 12 to follow the voltage at terminal 16. The zener-connected diode Z1 causes the voltage at terminal 10 to be maintained at a constant value with respect to the voltage at terminal 12, thereby maintaining a constant voltage across the fixed terminals of resistor R2. In a typical device, for example, the voltage of voltage source V1 would be on the order of 25 volts with the zener-connected diode Z1 maintaining a constant voltage drop of on the order of six volts. Typically the voltage at the source terminal S of transistor Q1, during non-conduction of the gate-source circuit, is more positive than the voltage at the gate terminal G of transistor Q1. Similarly, the voltage at the emitter of transistor Q2 is slightly more positive than the voltage appearing on its base terminal. Thus, for example, in a typical device the emitter voltage of transistor Q2 might be on the order of 1½ volts more positive than the voltage across the capacitor C1. With the voltage at terminal 12 following the voltage across the capacitor C1 with a voltage differential of, for example, 1½ volts and with the zener-connected diode Z1 maintaining the voltage at terminal 10 substantially six volts above the voltage at the junction 12, the voltage on the movable contact of variable resistor R2 can be adjusted between 1½ volts and 7½ volts above the voltage at junction 14, depending upon the desired period of the resulting saw-toothed wave form. That is, for a fixed R3 and C1, the adjustment of the resistor R2 determines the rate of increase of voltage across the capacitor C1. During the charging of capacitor C1, because the voltage across resistor R3 is maintained substantially constant, the capacitor C1 charges at a constant rate and the slope of the sawtoothed wave pattern is contant.

As the voltage across the capacitor C1 starts to rise, and the voltage at terminal 16 also starts to rise by following the voltage across capacitor C1, the emitter-to-base B1 current of the unijunction transistor Q3 is substantially zero. When the voltage at the emitter of unijunction transistor Q3 reaches a predetermined amplitude, the unijunction transistor Q3 begins to conduct between the emitter terminal E and the base B1 or common terminal. The emitter-to-base B1 circuit becomes effectively a negative resistance. Because of the conductive path between emitter E and base B1 terminal of the unijunction transistor Q3, the source terminal S of the field effect transistor Q1 becomes negative with respect to the gate terminal G of transistor Q1. Transistor Q1 becomes forward-biased causing substantial current to flow from the gate G to the source treminal S of transistor Q1. The forward biasing of transistor Q1 rapidly discharges capacitor C1 through the relatively low resistance of resistor R4 and the series connection of the gate-to-source junction of transistor Q1 and the emitter-to-base B1 junction of unijunction transistor Q3.

When the voltage across capacitor C1 has been reduced to a level where the emitter current of the unijunction transistor Q3 can no longer retain it in the negative resistance region of operation, unijunction transistor Q3 stops conducting through the emitter-to-base B1 circuit, and the emitter terminal of transistor Q3 appears as an open circuit.

Because transistor Q3 requires a certain amount of current flow before it moves into its negative resistance range or mode of operation, it may not be connected directly across the capacitor C1, for such a connection would apply a non-linear load to the capacitor C1 thereby distorting the linearity of the produced sawtoothed sweep voltage. With the transistor Q3 connected directly across capacitor C1, a large value of charging resistance of resistor R3 could not be used and a several limitation on on the range of slopes of the sawtoothed wave form would be imposed. Consequently, the field effect transistor Q1, which is reverse-biased during the charging of capacitor C1, acts as an isolator or buffer between the capacitor C1 and the discharge device 56. During its reverse-bias mode of operation, the field effect transistor Q1 appears as an open circuit to the charging capacitor C1.

The resistance of resistor R6 is chosen to be high enough so that once the capacitor C1 is discharged by the required amount, current delivered to the emitter of transistor Q3 from a voltage source V1 through resistors R1, R6 and the drain-to-source resistance of transistor Q1 is reduced by a sufficient amount so that the unijunction transistor Q3 stops conduction.

It should be noted that although a Zener-connected diode Z1 is used, that a Zener-connected transistor may also be used in place of the Zener-connected diode.

It should also be noted that although an emitter follower circuit 54 is used, other follower circuits, not having a phase-reversal, could be used in place of the emitter follower circuit.

Further, although a unijunction transistor discharge circuit appears preferable, other circuits having substantially the same characteristic, i.e., with a negative resistance, could be used in place of the shown unijunction transistor discharge circuit 56. For example, an npnp transistor can be made to have a negative resistance characteristic which, with a suitable associated biasing circuitry, can be made to have substantially the same characteristic as the unijunction transistor Q3.

In a sweep generator constructed in accordance with this invention, typical values of components and voltages used may be as follows:

| | | |
|---|---|---|
| V1, V4 | volts | 25 |
| V2, V3 | do | —25 |
| Q1 | | 2N4220 |
| Q2 | | 2N3645 |
| Q3 | | 2N2646 |
| Z1 | | [1] 2N3638 |
| C1 | microfarads | 0.1 |
| R1, R7, R8, R9, R10 | ohms | 1,000 |
| R2, R12 | do | 10,000 |
| R3 | megohms | 44 |
| R4 | ohms | 220 |
| R5 | do | 47,000 |
| R6 | do | 6,800 |
| R11 | do | 2,200 |

[1] Transistor, Zener-connected with the base terminal floating.

Figure 3:
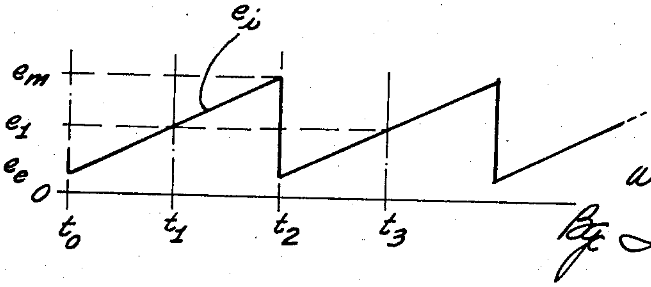
FIGURE 3 is a graph of the output voltage delivered by the circuit of FIGURE 2.

Referring to FIGURE 3, the voltage $e_l$ is typical of the voltage which appears across the capacitor C1 and of the voltage which appears at terminal 16 and at the output terminals. The minimum voltage of the sawtooth oscillator, in the absence of a voltage V3, is designated by $e_e$, and is determined by the characteristics of the unijunction transistor Q3 when it moves from its conduction mode into its non-conduction mode or from its negative resistance into a positive resistance mode. The value $e_m$ is determined by the voltage at the emitter of unijunction transistor Q3 which is necessary to cause the transistor Q3 to move into its conductive or negative resistance state. The output voltage curve of FIGURE 3 may be moved up and down by adjusting the polarity and magnitude of the voltage of voltage source V3.

Thus, because of the isolating characteristics of the field effect transistor Q1, the values of resistance of resistor R3 and capacitance of capacitor C1 may be chosen over a wide range of RC values to determine the slope and period of the sweep generator voltage. The unijunction discharge circuit is an inexpensive and convenient discharge circuit, but may not be used without the isolating field effect transistor circuit 52. The follower circuit 54 causes the output voltage of the current source 50 to follow the voltage across the capacitor C1 in a fashion to cause the current generator or source 50 to deliver a substantially constant, but adjustable current to the capacitor C1 during the charging mode of operation. Further, the follower circuit 54 isolates the output terminals from the operation of the circuit and adjusts the output impedance, the excursion of the voltage out of the saw-toothed oscillator, and the bias of the saw-toothed output voltage.

It should also be noted that the circuit operates properly with the polarities of all transistors, diodes, and voltages reversed, using a "p channel" field effect transistor for Q1, an npn transistor for Q2, and a "n type" emitter unijunction transistor for Q3. Note will be taken that returning the drain D to point 10 reduces the available current for the unijunction Q3 with the discharge of capacitor C1. This is important because a reduction in drain potential may be critical to reduce the unijunction emitter current below cutoff upon such discharge. Note will be taken that the potential of point 10 rises and falls with the capacitor voltage.

What is claimed as new is:

1. In a sweep genator, the combination comprising:
- a resistor-capacitor network;
- a current source connected to said network to charge said capacitor;
- a discharge circuit for periodically discharging said capacitor;
- a field effect transistor isolation circuit between said network and said discharge circuit to prevent said discharge circuit from loading said capacitor during charging of said capacitor; and
- a feedback network, connected to be responsive to the voltage across said capacitor and to control said current source to cause said current source to deliver a substantially constant current to said network during charging of said capacitor.

2. The combination of claim 1 in which said discharge circuit comprises:
- a unijunction transistor having an emitter and first and second base;
- means for biasing one of said bases;
- the second one of said bases being connected to said resistor-capacitor network; and
- the emitter of said unijunction transistor being connected through said field effect transistor isolation circuit to receive current from said capacitor and to at least partially discharge said capacitor when the voltage across said capacitor reaches a predetermined value.

3. The combination of claim 1 in which said field effect transistor isolation circuit comprises:
- a field effect transistor having gate, source, and drain terminals;
- means, including a current limiting resistor, for biasing said source and drain terminals toward conduction, and for back biasing said gate terminal against conduction;
- said source terminal of said field effect transistor being connected to said discharge circuit to forward bias said gate terminal during discharge of said capacitor.

4. The combination of claim 1 in which said feedback network comprises:
- an emitter follower network including a transistor and a resistor network in the emitter circuit of said transistor, the output voltage of said combination being across at least one of said resistors of said last named resistor network, and the output voltage of said emitter follower being connected to said current source to cause said current source to deliver a substantially constant current to said resistor-capacitor network during the charging of said capacitor.

5. The combination of claim 1 in which said current source comprises:

a variable resistor in parallel with a Zener-connected diode;

a voltage source in series with resistor, connected to a first one of the fixed terminals of said variable resistor;

the second one of the fixed terminals of said variable resistor being connected to an output of said feedback network; and the movable contact of said variable resistor being connected to deliver current to said resistor-capacitor network.

6. The combination of claim 1 in which:

said resistor and capacitor of said resistor-capacitor network are connected in series between said current source and a common terminal;

said field effect transistor isolation circuit comprises a field effect transistor whose gate terminal is connected through a current limiting resistor to the junction between said resistor and capacitor, the gate of said field effect transistor being back biased with respect to its source and drain terminals during charging of said capacitor, voltage and resistor means connected to said source and drain terminals to cause the voltage upon said source terminal to track the voltage across said capacitor during charging of said capacitor; and Said discharge circuit comprises a unijunction transistor, one of whose bases is connected to said common terminal, and whose emitter is connected to the source terminal of said field effect transistor.

7. The combination of claim 6 in which:

said feedback circuit comprises a transistor whose base is connected through a resistor to said source terminal of said field effect transistor, and whose emitter is connected through a resistor network to said common terminal, the emitter of said last named transistor being connected to control the voltage applied to said resistor-capacitor network to cause it to track the voltage across said capacitor.

8. The combination of claim 7 in which:

said current source comprises a variable resistor, a diode Zener-connected across the fixed terminals of said resistor, a voltage source in series with a resistor connected to a first one of said fixed terminals, the emitter of said last named transistor being connected to the second one of said fixed terminals, the movable contact of said resistor being connected to the resistor of said resistor-capacitor combination, and the drain terminal of said field effect transistor being connected through a current limiting resistor to said first terminal of said variable resistor.

9. The combination of claim 8 in which said feedback circuit further comprises a biasing voltage source connected to said resistor network to bias the excursion of the sawtooth voltage appearing across at least one of the resistor of said resistor network.

10. The combination of claim 9 in which said field effect transistor is a metal-oxide silicon n channel transistor.

11. The invention as defined in claim 1, wherein said field effect transistor isolation circuit includes a field effect transistor source follower circuit including a field effect transistor having a source and drain, and means for maintaining said drain at a potential which decreases with the discharge of said capacitor.

References Cited

UNITED STATES PATENTS 3,158,822 11/1964 Brechling ---------- 331—111

ROY LAKE, *Primary Examiner.*

SIEGFRIED H. GRIMM, *Assistant Examiner.*

U.S. Cl. X.R.

307—228; 331—143